(12) United States Patent
Klinger et al.

(10) Patent No.: US 7,816,723 B2
(45) Date of Patent: Oct. 19, 2010

(54) SEMICONDUCTOR MEMORY ARRAY OF FLOATING GATE MEMORY CELLS WITH PROGRAM/ERASE AND SELECT GATES

(75) Inventors: Pavel Klinger, San Jose, CA (US); Amitay Levi, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 18 days.

(21) Appl. No.: 11/950,331

(22) Filed: Dec. 4, 2007

(65) Prior Publication Data

US 2008/0083945 A1   Apr. 10, 2008

Related U.S. Application Data

(62) Division of application No. 10/863,030, filed on Jun. 7, 2004, now Pat. No. 7,315,056.

(51) Int. Cl.
    H01L 29/788 (2006.01)
(52) U.S. Cl. ............... 257/315; 257/314; 257/E27.103; 257/E29.3; 257/E29.308; 365/185.14; 365/185.18; 365/185.29
(58) Field of Classification Search ............... 257/315, 257/314, E27.103, E29.3, E29.308; 365/185.14, 365/185.18, 185.29
    See application file for complete search history.

(56) References Cited

U.S. PATENT DOCUMENTS

| 4,462,090 A | 7/1984 | Iizuka |
| 4,698,787 A | 10/1987 | Mukherjee et al. |
| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |

(Continued)

FOREIGN PATENT DOCUMENTS

EP        0389721        10/1990

(Continued)

OTHER PUBLICATIONS

U.S. Appl. No. 10/622,855, filed Jul. 18, 2003, Levi et al.

(Continued)

*Primary Examiner*—Andy Huynh
(74) *Attorney, Agent, or Firm*—DLA Piper LLP (US)

(57) ABSTRACT

A memory device, and method of making and operating the same, including a substrate of semiconductor material of a first conductivity type, first and second spaced apart regions in the substrate of a second conductivity type with a channel region therebetween, an electrically conductive floating gate having a first portion disposed over and insulated from the channel region and a second portion disposed over and insulated from the first region and including a sharpened edge, an electrically conductive P/E gate having a first portion disposed over and insulated from the first region and a second portion extending up and over the floating gate second portion and insulated therefrom by a first layer of insulation material, and an electrically conductive select gate having a first portion disposed laterally adjacent to the floating gate and disposed over and insulated from the channel region.

4 Claims, 5 Drawing Sheets

U.S. PATENT DOCUMENTS

| | | | |
|---|---|---|---|
| 5,041,886 A | 8/1991 | Lee | |
| 5,101,250 A | 3/1992 | Arima et al. | |
| 5,194,925 A | 3/1993 | Ajika et al. | |
| 5,268,319 A | 12/1993 | Harari | |
| 5,280,446 A | 1/1994 | Ma et al. | |
| 5,293,337 A | 3/1994 | Aritome et al. | |
| 5,303,187 A | 4/1994 | Yu | |
| 5,338,952 A | 8/1994 | Yamauchi | |
| 5,414,286 A | 5/1995 | Yamauchi | |
| 5,429,965 A | 7/1995 | Shimoji | |
| 5,493,138 A | 2/1996 | Koh | |
| 5,544,103 A | 8/1996 | Lambertson | |
| 5,572,054 A | 11/1996 | Wang et al. | |
| 5,751,048 A | 5/1998 | Lee et al. | |
| 5,780,341 A | 7/1998 | Ogura | |
| 5,780,892 A | 7/1998 | Chen | |
| 5,789,293 A | 8/1998 | Cho et al. | |
| 5,796,139 A | 8/1998 | Fukase | |
| 5,808,328 A | 9/1998 | Nishizawa | |
| 5,811,853 A | 9/1998 | Wang | |
| 5,814,853 A | 9/1998 | Chen | |
| 5,856,943 A | 1/1999 | Jeng | |
| 5,912,843 A | 6/1999 | Jeng | |
| 5,939,749 A | 8/1999 | Taketa et al. | |
| 5,954,818 A * | 9/1999 | Dalvi et al. | 726/16 |
| 6,091,104 A | 7/2000 | Chen | |
| 6,103,573 A | 8/2000 | Harari et al. | |
| 6,136,648 A | 10/2000 | Oya | |
| 6,140,182 A | 10/2000 | Chen | |
| 6,157,575 A | 12/2000 | Choi | |
| 6,222,227 B1 | 4/2001 | Chen | |
| 6,252,799 B1 | 6/2001 | Liu et al. | |
| 6,329,685 B1 | 12/2001 | Lee | |
| 6,369,420 B1 | 4/2002 | Yeh et al. | |
| 6,414,350 B1 | 7/2002 | Hsieh et al. | |
| 6,524,915 B2 | 2/2003 | Kim et al. | |
| 6,525,371 B2 | 2/2003 | Johnson | |
| 6,531,734 B1 | 3/2003 | Wu | |
| 6,563,167 B2 | 5/2003 | Chern | |
| 6,570,213 B1 | 5/2003 | Wu | |
| 6,621,115 B2 | 9/2003 | Jenq et al. | |
| 6,624,465 B1 | 9/2003 | Chien et al. | |
| 6,627,946 B2 | 9/2003 | Wang | |
| 6,696,340 B2 | 2/2004 | Furuhata | |
| 6,706,592 B2 | 3/2004 | Chern et al. | |
| 6,727,545 B2 | 4/2004 | Wang et al. | |
| 6,747,310 B2 | 6/2004 | Fan | |
| 7,046,552 B2 | 5/2006 | Chen et al. | |
| 2004/0065917 A1 | 4/2004 | Fan et al. | |
| 2005/0036393 A1 | 2/2005 | Jenq et al. | |

OTHER PUBLICATIONS

U.S. Appl. No. 10/714,243, filed Nov. 13, 2003, Chen et al.

\* cited by examiner

SEMICONDUCTOR MEMORY ARRAY OF FLOATING GATE MEMORY CELLS WITH PROGRAM/ERASE AND SELECT GATES

This application is a divisional of U.S. application Ser. No. 10/863,030 now U.S. Pat. No. 7,315,056, filed Jun. 7, 2004.

TECHNICAL FIELD

The present invention relates to a self-aligned method of forming a semiconductor memory array of floating gate memory cells of the split gate type. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof, using a control gate to program, erase and read the memory cell.

Two major issues are often implicated as memory cell dimensions are scaled down. First, the resistance in the source line increases with smaller memory cell dimensions, and a higher resistance suppresses the desirable cell current during a read event. Second, smaller memory cell dimensions result in a lower punch-through voltage $V_{PT}$ between the source and the bitline junction, which limits the achievable maximum floating-gate voltage $V_{fg}$ during a program event. Floating-gate voltage $V_{fg}$ is achieved through voltage coupling from the source region through the coupling oxide layer that is between the source and the floating gate. In a source-side injection mechanism, a higher $V_{fg}$ (and thus a higher punch-through voltage $V_{PT}$) is essential for a sufficient hot carrier injection efficiency.

SUMMARY OF THE INVENTION

The present invention solves the problem of low read current. With prior art devices, the same gate is used for read and erase, thereby limiting the operational window between read current and leakage current on unselected cells. By separating read and erase nodes, and allowing the read gate to use a thin oxide insulation, a high cell read current can be achieved without increasing currents on unselected cells.

An electrically programmable and erasable memory device includes a substrate of semiconductor material of a first conductivity type, first and second spaced-apart regions in the substrate of a second conductivity type, with a channel region therebetween, an electrically conductive floating gate having a first portion disposed over and insulated from the channel region, and a second portion disposed over and insulated from the first region and including a sharpened edge, an electrically conductive P/E gate having a first portion disposed over and insulated from the first region, and a second portion extending up and over the floating gate second portion and insulated therefrom by a first layer of insulation material, and an electrically conductive select gate disposed laterally adjacent to and insulated from the floating gate and disposed over and insulated from the channel region, wherein the sharpened edge is formed at an intersection of a sloping upper surface of the floating gate and a side surface of the floating gate.

An array of electrically programmable and erasable memory devices includes a substrate of semiconductor material of a first conductivity type, spaced apart isolation regions formed on the substrate which are substantially parallel to one another and extend in a first direction, with an active region between each pair of adjacent isolation regions, each of the active regions including pairs of memory cells. Each of the memory cell pairs includes a first region and a pair of second regions spaced apart in the substrate having a second conductivity type, with channel regions formed in the substrate between the first region and the second regions, a pair of electrically conductive floating gates each having a first portion disposed over and insulated from one of the channel regions, and a second portion disposed over and insulated from the first region and including a sharpened edge, wherein for each of the floating gates, the sharpened edge is formed at an intersection of a sloping upper surface of the floating gate and a side surface of the floating gate, an electrically conductive P/E gate having a first portion disposed over and insulated from the first region, and a pair of second portions each extending up and over one of the floating gate second portions and insulated therefrom by a first layer of insulation material, and a pair of electrically conductive select gates each disposed laterally adjacent to and insulated from one of the floating gates and disposed over and insulated from the channel region.

Other objects and features of the present invention will become apparent by a review of the specification, claims and appended figures.

DETAILED DESCRIPTION OF THE PREFERRED EMBODIMENTS

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

Isolation Region Formation

Figure 1A:
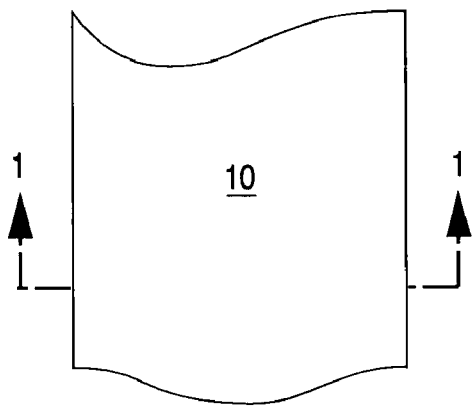
FIG. 1A is a top view of a semiconductor substrate used in the first step of the method of present invention to form isolation regions.
Figure 1B:
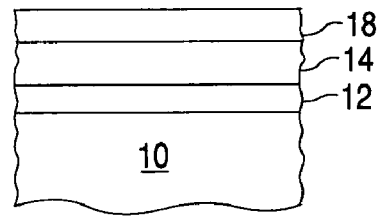
FIG. 1B is a cross sectional view taken along the line 1-1.

Referring to FIG. 1A there is shown a top plan view of a semiconductor substrate 10, which is preferably of P type and is well known in the art. A first layer of insulation material 12, such as silicon dioxide (oxide), is deposited thereon as shown in FIG. 1B. The first insulation layer 12 is formed on the substrate 10 by well known techniques such as oxidation or deposition (e.g. chemical vapor deposition or CVD), forming a layer of silicon dioxide (hereinafter "oxide"). A first layer of polysilicon 14 (FG poly) is deposited on top of the first layer of insulation material 12. The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD. This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 1C:
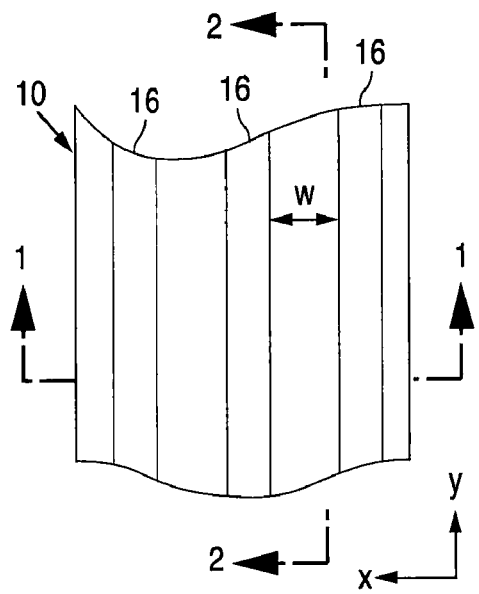
FIG. 1C is a top view of the next step in the processing of the structure of FIG. 1B, in which isolation regions are formed.
Figure 1D:
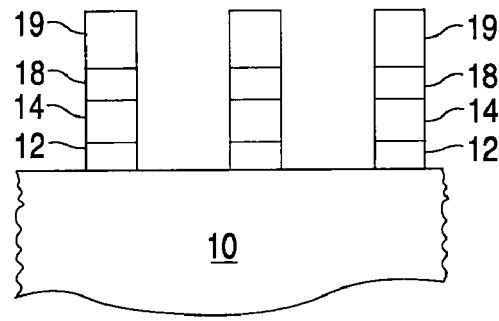
FIG. 1D is a cross sectional view of the structure in FIG. 1C taken along the line 1-1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y direction or the column direction, as shown in FIG. 1C, using standard etching techniques (i.e. anisotropic etch process). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 1D. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 1E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 1E:
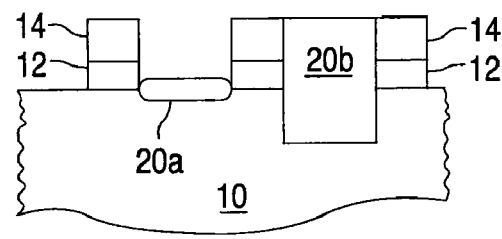
FIG. 1E is a cross sectional view of the structure in FIG. 1C taken along the line 1-1 showing the two types of isolation regions that can be formed in the semiconductor substrate: LOCOS or shallow trench.

The remaining first polysilicon layer 14 and the underlying first insulation material 12 form the active regions 22. Thus, at this point, the substrate 10 has alternating stripes of active regions 22 and isolation regions 23 with the isolation regions 23 being formed of either LOCOS insulation material 20a or shallow trench insulation material 20b. Although FIG. 1E shows the formation of both a LOCOS region 20a and a shallow trench region 20b, only one of the LOCOS process (20a) or the shallow trench process (20b) will be used. In the preferred embodiment, the shallow trench insulation 20b will be formed. Shallow trench insulation 20b is preferable because it can be more precisely formed at smaller design rules.

The structure in FIG. 1E represents a self aligned structure, which is more compact than a structure formed by a non self-aligned method. A non self-aligned method of forming the structure shown in FIG. 1E, which is well known and is conventional, is as follows. Regions of isolation 20 are first formed in the substrate 10. This can be done by forming a pad oxide layer and a layer of silicon nitride on the substrate 10, depositing photo-resist, patterning the silicon nitride and pad oxide using a first masking step to expose selective portions of the substrate 10, and then oxidizing the exposed substrate 10 using either the LOCOS process or performing the STI process where silicon trench formation and trench fill are involved. Thereafter, the silicon nitride and pad oxide are removed, a first layer of silicon dioxide 12 (to form the gate oxide) is deposited over the substrate 10, and a first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

As explained below, in the exemplary embodiment, the later formed source lines 38 will extend continuously across the active 22 and isolation 23 regions. Thus, gaps in strips 16 are left by the masking step used to form isolation material 20a/20b, so that gap portions are left in the insulation material that extend across the isolation regions which are aligned with the locations at which the source lines 38 are to be formed.

Memory Cell Formation

Figure 2A:
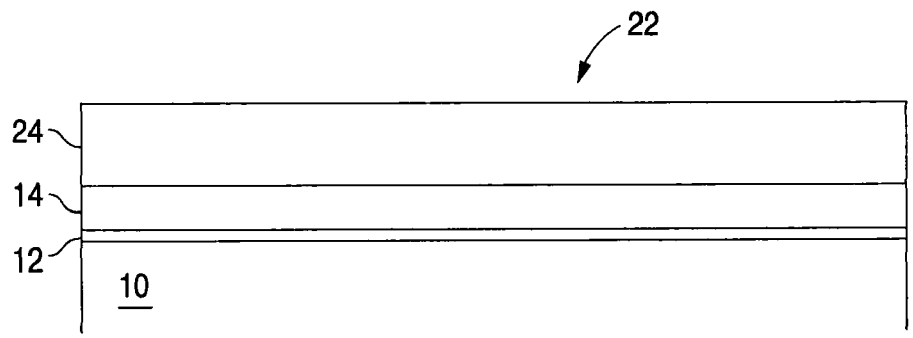
FIGS. 2A-2J are cross sectional views taken along the line 2-2 of FIG. 1C showing in sequence the next step(s) in the processing of the structure shown in FIG. 1C, in the formation of a non volatile memory array of floating memory cells of the split gate type.

With the structure shown in FIG. 1E made using either the self aligned method or the non self-aligned method, and using either LOCOS or STI, the structure is further processed as follows. Referring to FIG. 2A, which shows the structure in one of the active regions 22 from a view orthogonal to that of FIGS. 1B and 1E, the next steps in the process of the present invention are illustrated. A thick layer 24, such as silicon nitride (hereinafter "nitride") is formed on the structure as illustrated in FIG. 2A.

Figure 2B:
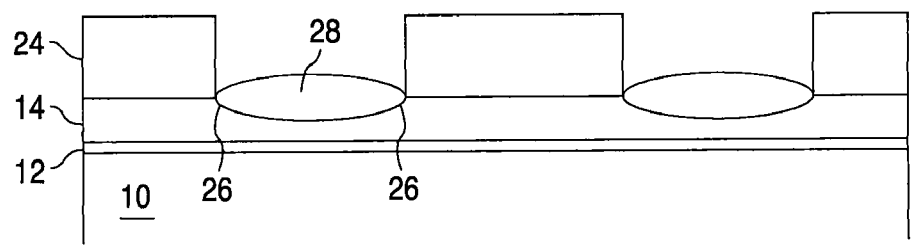

A conventional photo-lithography masking operation is performed with photo-resist applied over nitride layer 24. A masking step is applied in which stripes (i.e. masking regions) are defined in the X or the row direction. The distance between adjacent stripes can be a size determined by the needs of the device to be fabricated. The photo resist is removed in defined masking regions, i.e. stripes in the row direction, after which nitride layer 24 underlying the removed photo resist is etched away in the stripes using a conventional anisotropic nitride etch process to expose portions of poly layer 14. An optional poly etch process can follow to remove just a top portion of the exposed poly layer 14, to slightly recess poly layer 14 relative to the remaining nitride layer 24, and to form sloping portions 26 of poly layer 14 where layer 14 meets nitride layer 24. A layer 28 of insulation material, such as silicon dioxide (hereinafter "oxide") is then formed on the exposed portion of poly layer 14 using, for example, a thermal oxidation process. The sloping portions 26 of poly layer 14 are enhanced by the oxidation process. The remaining photo-resist is then removed, resulting in the structure shown in FIG. 2B.

Figure 2C:
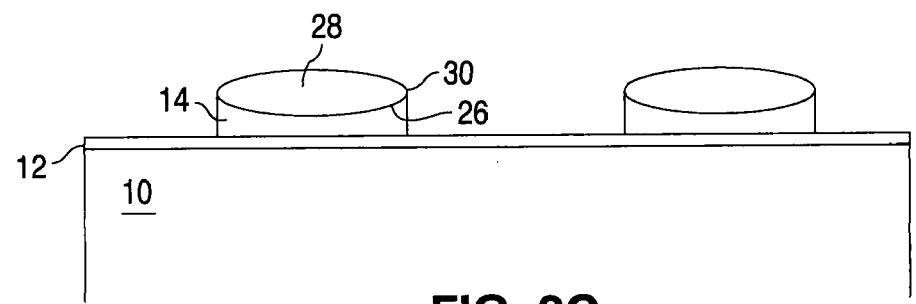

A nitride etch process is next used to remove nitride layer 24. An anisotropic poly etch is then used to remove exposed portions of the poly layer 14 (i.e. those portions of poly layer 14 not protected by oxide layer 28). The resulting structure is shown in FIG. 2C. Each of the sloping portions 26 of poly layer 14 terminate in a sharpened (pointed) edge 30 (where the sloping portion 26 of the top surface of poly layer 14 intersects with the side surface of layer 14).

Figure 2D:
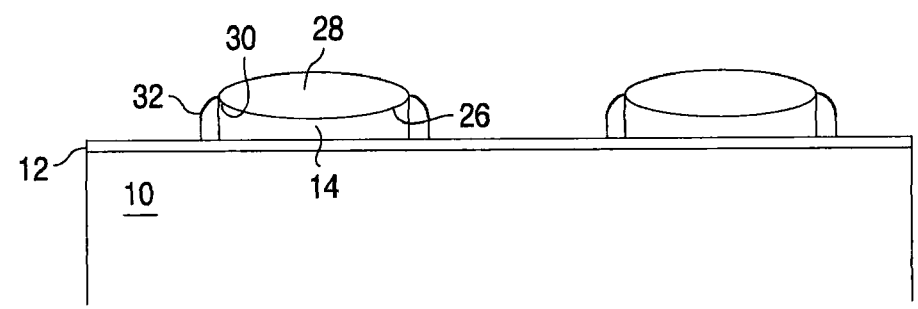

Insulation spacers 32 are then formed along the sides of poly layer 14. Formation of spacers is well known in the art by depositing a material over the contour of a structure, followed by an anisotropic etch process (e.g. RIE), whereby the material is removed from horizontal surfaces of the structure, while the material remains largely intact on vertically oriented surfaces of the structure. Spacers 32 can be formed of any dielectric material. In the preferred embodiment, spacers 32 are formed of nitride in the following manner. A layer of insulation material (i.e. nitride) is formed over the structure preferably by a conventional nitride deposition process. This is followed by a nitride etch process that uses oxide layer 28 as an etch stop. This etch process removes all of the nitride, except for spacers 32 along the sidewalls of poly layer 14. The resulting structure is shown in FIG. 2D.

Figure 2E:
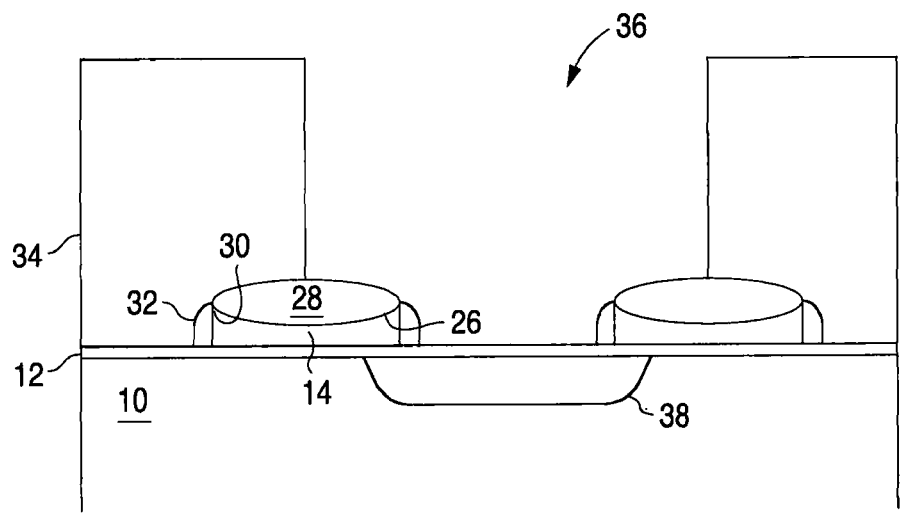

Masking material is formed over the structure, such as photo resist 34, which is removed only in select portions using a standard photolithography process to expose trenches 36 between selected sets of oxide/poly 28/14, with the photo resist preferably only partially overlapping oxide/poly 28/14 as shown in FIG. 2E. Suitable ion implantation is then made across the entire surface of the structure. Where the ions have sufficient energy to penetrate the oxide layer 12 in trench 36, they then form a first (source) region 38 in the substrate 10. In all other regions, the ions are absorbed by the existing structure, where they have no effect. In the exemplary embodiment, the source lines 38 extend continuously across the active 22 and isolation 23 regions. Thus, when the isolation material 20a/20b is formed, the isolation region masking step is performed to exclude gap portions that extend across the isolation regions and which are aligned with the locations at which the source lines 38 are formed.

Figure 2F:
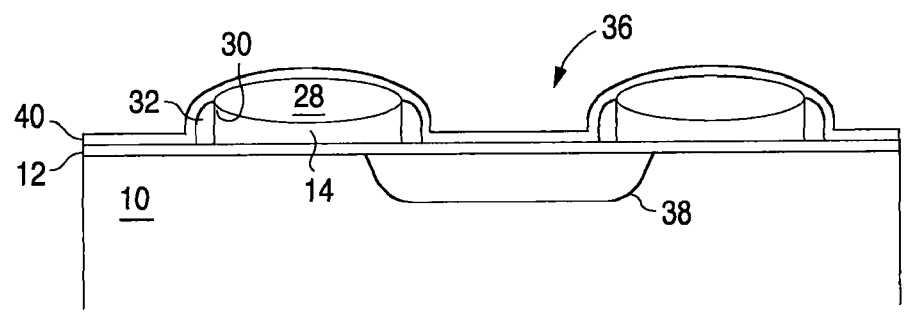
Figure 2G:
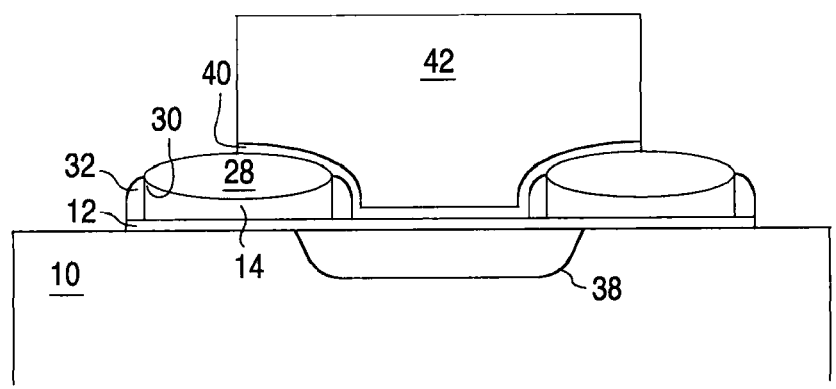
Figure 2H:
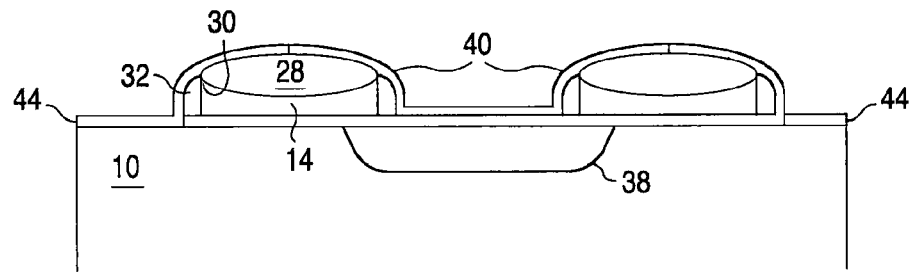

After the removal of photo resist 34, oxidation (e.g. thermal) and/or oxidation deposition (e.g. by HTO deposition) is performed to form a thin layer of oxide 40 (e.g. 140 Å to 200 Å) over the structure, as shown in FIG. 2F. The formation of oxide layer 40 provides a tunneling oxide layer adjacent to the sharpened (pointed) edge 30 having a controlled thickness. Due to the heavy doping in the source region 38, the portion of oxide layer 40 over source region 38 is formed with a greater thickness, providing reliable isolation between the P/E gate (to be subsequently formed) and the source region 38. Masking material is again formed over the structure, such as photo resist 42, which is removed only in select portions using a standard photolithography process to expose portions of the structure except for trenches 36 and portions of the structure immediately adjacent thereto (e.g. the photo resist 42 partially overlaps with oxide layer 28). An oxide etch process is then used to remove exposed portions of oxide layers 40 and 12 (those portions not protected by photo resist 42 or oxide layer 28, as shown in FIG. 2G). Then, an oxide formation process, such as thermal oxidation, is performed to form oxide layer 44 over substrate 10 that extends up and over spacers 32, poly layer sharpened edge 30 and oxide layer 28. The resulting structure (after the removal of photo resist 42) is shown in FIG. 2H. By forming oxide layers 40 and 44 separately, each can be optimized for thickness as discussed further below.

Figure 2I:
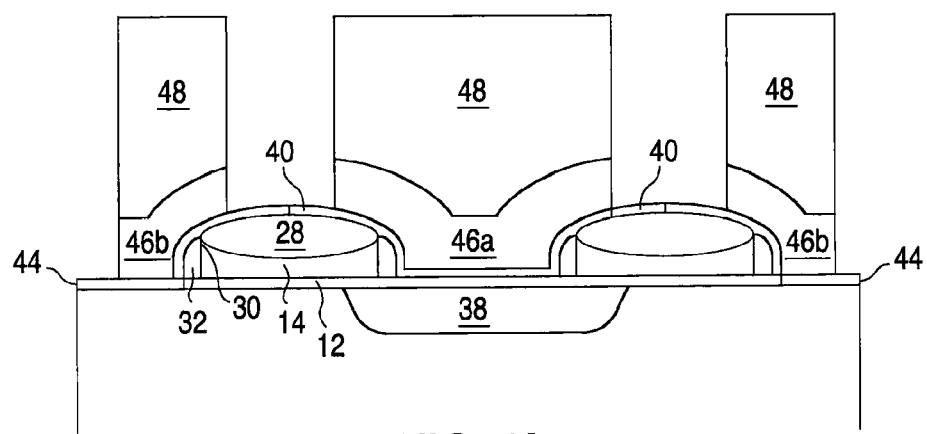

A thick layer of polysilicon 46 is next formed over the structure. A masking layer 48 (e.g. photo resist) is formed over the poly layer 46, and selectively removed to expose selected portions of poly layer 46 (e.g. portions over oxide layer 28, and over portions of oxide layer 44 directly over substrate 10). An anisotropic poly etch is then used to remove the exposed portions of poly layer 46, leaving separate poly blocks 46a and 46b, as illustrated in FIG. 2I. Poly blocks 46a are disposed over and insulated from source regions 38, and extend up and over adjacent portions of poly layer 14 (and sharpened edges 30 thereof). Poly blocks 46b are disposed over and insulated from substrate 10, and extend up and over adjacent portions of poly layer 14 (and sharpened edges 30 thereof).

After the photo resist 48 is removed, insulation spacers 50 (e.g. nitride) are formed along the sides of poly layer 46 via a nitride deposition and anisotropic etch process. Ion implantation (e.g. N+) follows, which forms second (drain) regions 52 in the substrate 10 in the same manner as the first (source) regions 38 were formed. A controlled oxide etch follows, which removes the exposed portions of oxide layer 44 primarily over second (drain) regions 52. An optional metalization process may be performed, which forms a layer of metalized silicon (silicide) in the top of the substrate 10 (in drain regions 52) and a layer of metalized silicon over poly blocks 46a/46b, by depositing a metal such as tungsten, cobalt, titanium, nickel, platinum, or molybdenum over the structure and annealing. The metal deposited on the remaining structure is removed by a metal etch process. Passivation, such as BPSG 54, is used to cover the entire structure. A masking step is performed to define etching areas over the drain regions 52. The BPSG 54 is selectively etched in the masked regions to create contact openings that are ideally centered over and extend down to drain regions 52 formed between adjacent sets of paired memory cells. The contact openings are then filled with a conductor metal by metal deposition and planarization etch-back to form contact conductors 56. The silicide over drain regions 52 facilitate conduction between the contact conductors 56 and drain regions 52. A bit line 58 is added by metal masking over the BPSG 54, to connect together all the contact conductors 56 in each active region 22. The final memory cell structure is illustrated in FIG. 2J.

Figure 2J:
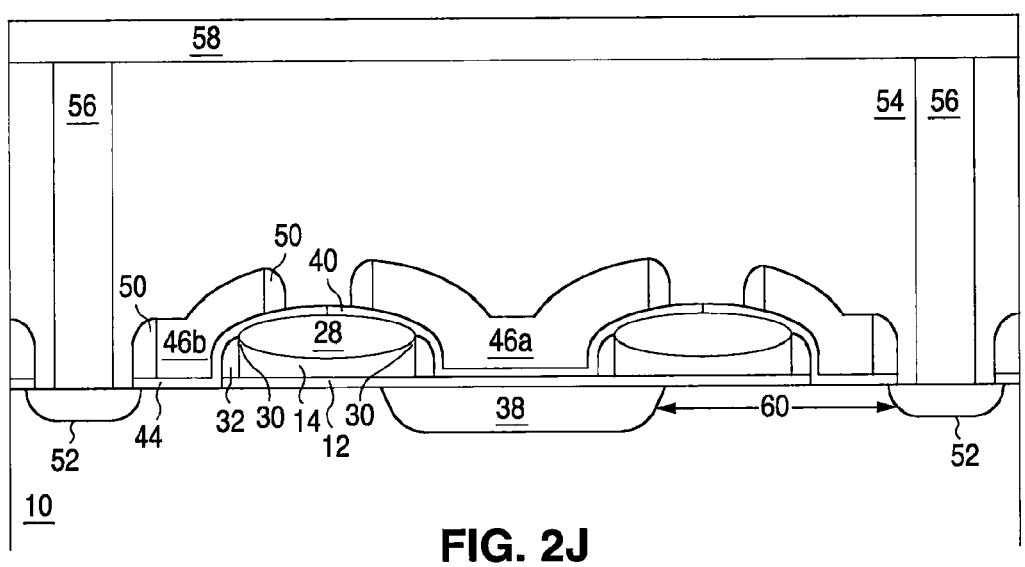

As shown in FIG. 2J, first and second regions 38/52 form the source and drain for each cell. A channel region 60 for each cell is the portion of the substrate that is in-between the source and drain 38/52. For each memory cell, poly layer 14 constitutes the floating gate, poly block 46a constitutes the program/erase (P/E) gate, and poly block 46b constitutes the select (word line) gate. Oxide layer 12 insulates the floating gate 14 from the substrate 10. Oxide layer 44 insulates select gate 46b from the floating gate 14 and the substrate 10. Oxide layer 40 insulates the P/E gate 46a from a pair of the floating gates 14 (and the sharpened edges 30 thereof) and from the substrate 10 therebetween (along with oxide layer 12). The select gates 46b each have a lower portion that is disposed over (and insulated from) the substrate 10, and laterally adjacent to and insulated from the floating gate 14. The select gates 46b also each include an upper portion that extends up and over the floating gate 14. Each floating gate 14 is disposed over part of the channel region 60, is partially overlapped at one end by the select gate 46b, partially overlaps the first (source) region 38 with its other end, and is partially overlapped at the other end by the P/E gate 46a. The P/E gate 46a has a lower portion that is disposed over and insulated from the source region 38 of the substrate 10, and a pair of upper portions each extending up and over one of the floating gates 14 (and sharpened edge 30 thereof). It should be noted that the process of the present invention forms a second sharpened edge 30 on floating gate 14 that faces the select gate 46b, but this second sharpened edge serves no functional purpose and can be ignored. The process of the present invention forms pairs of memory cells that mirror each other. The pairs of mirrored memory cells are insulated from other cell pairs by spacers 50 and BPSG 54.

Figure 3:
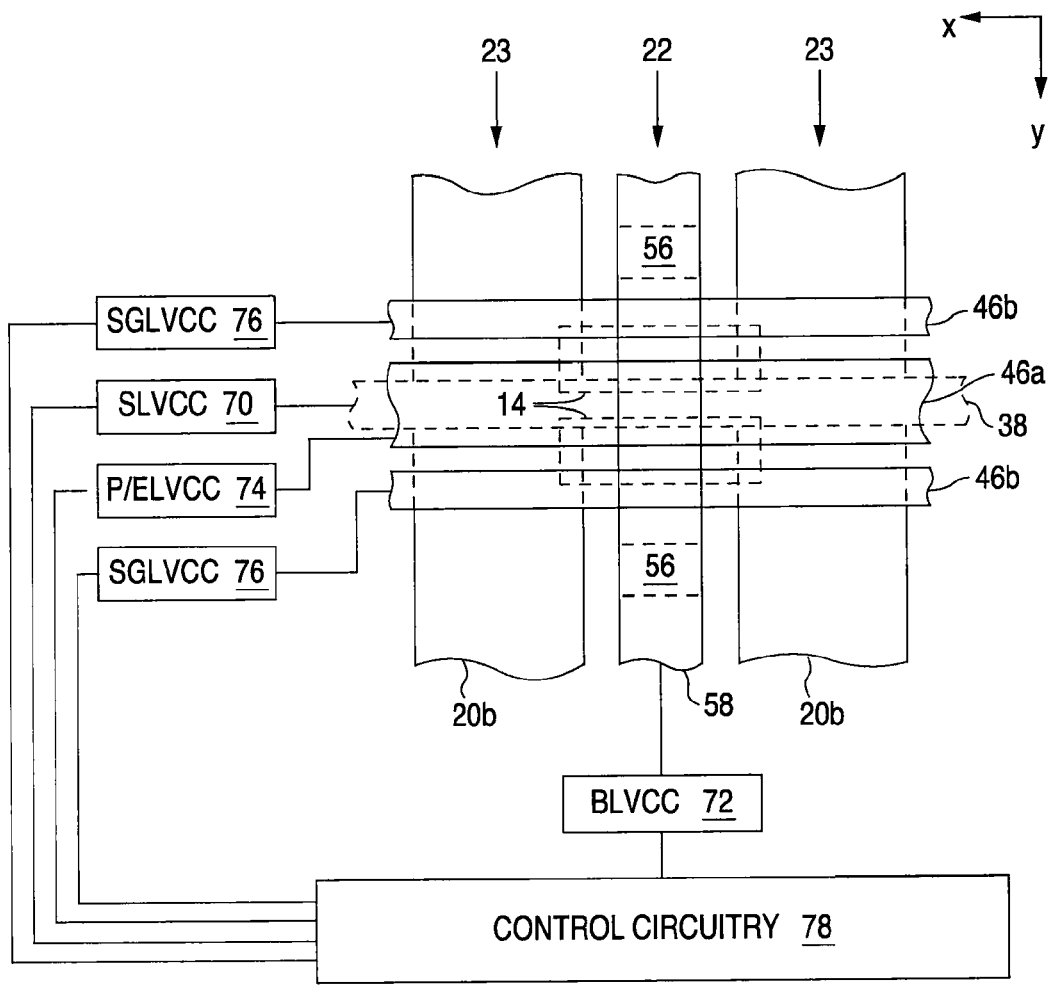
FIG. 3 is a top view of the memory cell array of the present invention.

FIG. 3 is a top plan view of the resulting structure showing the isolation material 20b formed in the isolation regions 23. This Fig. also shows floating gates 14, the bit line 58 extending in the Y (column) direction (and interconnected with contacts 56 over drain regions 52), and the word lines 46b and P/E gate line 46a which run in the X or the row direction. The select gates 46b for each row of memory cells are formed as a single word line (all electrically connected together), and the P/E gates 46a for each row of paired memory cells are formed as a single P/E gate line (all electrically connected together).

The memory cell array includes peripheral circuitry including conventional row address decoding circuitry, column address decoding circuitry, sense amplifier circuitry, output buffer circuitry, input buffer circuitry, etc., which are well known in the art. For example, as shown in FIG. 3, each source line 38 is connected to a source line voltage control circuit (SLVCC) 70 for controlling the voltage on source line 38. Each bit line 58 is connected to a bit line voltage control circuit (BLVCC) 72 for controlling the voltage on bit line 58 (and the drain regions 52 connected thereto). Each P/E gate line 46a is connected to a program/erase line voltage control circuit (P/ELVCC) 74 for controlling the voltage on P/E gate line 46a. And, each select gate line 46b is connected to a select gate line voltage control circuit (SGLVCC) 76 for controlling the voltage on select gate line 46b. These voltage control circuits are all connected to and controlled by control circuitry 78 that operates the voltage control circuits to effectuate the programming, erasure, and reading of the various memory cells in the memory array.

Memory Cell Operation

The operation of the memory cells will now be described below. The operation and theory of operation of similar type memory cells are also described in U.S. Pat. No. 5,572,054, whose disclosure is incorporated herein by reference with regard to the operation and theory of operation of a non-volatile memory cell having a floating gate.

The voltage control circuits 70/72/74/76, under the control of control circuitry 78, provide the following voltages to erase, program, and read a selected memory cell, as described in more detail below:

| Operation | Select Gate 46b (Volts) | Drain 52 | P/E Gate 46a (Volts) | Source 38 (Volts) |
|---|---|---|---|---|
| Erase | 0 | 0 Volts | 10 to 12 | 0 |
| Program | 1 to 2 | $I_{prog}$ (~1 uA) | 4 to 6 | 6 to 8 |
| Read | 1.5 to 3.3 | 0.5 to 1.0 Volts | 0 | 0 |

To initially erase a selected memory cell in any given active region 22, a ground potential is applied to its source 38, its drain 52 (via bit-line 58), and its select gate 46b. A high-positive voltage (e.g. +10 to 12 volts), is applied to its P/E gate 46a. Electrons on the floating gate 14 are induced through the Fowler-Nordheim tunneling mechanism to tunnel through the oxide layer 40 to the P/E gate 46a, leaving the floating gate 14 positively charged. Tunneling is enhanced by the sharpened edge 30 of floating gate 14 that directly faces the P/E gate 46a. It should be noted that since any given P/E gate 46a is formed as a continuous line running across active and isolation regions 22/23 and along two rows of memory cells, that all the memory cells in those two rows are 'erased' simultaneously by the high positive voltage on the single P/E gate line 46a.

When a selected memory cell is desired to be programmed, a small current is sunk from the drain region 52 (e.g. ~1 uA). A positive voltage level (e.g. in the vicinity of the threshold voltage of the MOS structure defined by the select gate 46b, which can be on the order of approximately 1 to 2 volts) is applied to its select gate 46b. A positive high voltage (e.g. 6 to 8 volts) is applied to its source region 38. Lastly, a positive voltage (e.g. 4 to 6 volts) is applied it its P/E gate 46a. Electrons generated by the drain region 52 will flow from the drain region 52 towards the source region 38 through the weakly-inverted portion of the channel region 60 (underneath select gate 46b). As the electrons reach the portion of channel region 60 underneath floating gate 14, the electrons will see the high potential of the near end of floating gate 14 (because the floating gate 14 is more strongly capacitively coupled to the positively charged source region 38 and P/E gate 46a than to the select gate 46b). The electrons will accelerate and become heated, with many of them being injected into and through the insulating layer 12 and onto the floating gate 14, thus negatively charging the floating gate 14. Voltage Vdd (e.g. approximately 1.5 to 3.3 volts depending upon the power supply voltage of the device) is applied to the bit-lines 58 for memory cell columns not containing the selected memory cell, as well as ground potential to the select gates 46b for memory cell rows not containing the selected memory cell. Thus, only the memory cell in the selected row and column is programmed.

The injection of electrons onto the floating gate 14 will continue until the reduction of the charge on the near end of the floating gate 14 can no longer sustain a high surface potential along the adjacent channel region portion to generate hot electrons. At that point, the electrons or the negative charges in the floating gate 14 will decrease the electron flow from the drain region 52 onto the floating gate 14.

Finally, to read a selected memory cell, ground potential is applied to its source region 38 and its P/E gate 46a. A read voltage is applied to its drain region 52 (e.g. approximately +0.5 to 1.0 volts) and to its select gate 46b (e.g. approximately 1.5 to 3.3 volts, depending upon the power supply voltage of the device). If the floating gate 14 is positively charged (i.e. the floating gate is discharged of electrons), then the portion of the channel region 60 directly underneath the floating gate 14 is turned on. When the select gate 46b is raised to the read potential, the portion of the channel region 60 directly underneath the select gate 46b is also turned on. Thus, the entire channel region 60 will be turned on, causing electrical current to flow from the source region 38 to the drain region 52. This would be the "1" state.

On the other hand, if the floating gate 14 is negatively charged, the portion of the channel region 60 directly below the floating gate 14 is either weakly turned on or is entirely shut off. Even when the select gate 46b and the drain region 52 are raised to their read potentials, little or no current will flow through the portion of channel region 60 under floating gate 14. In this case, either the current through the entire channel region 60 is very small compared to that of the "1" state or there is no current at all. In this manner, the selected memory cell is sensed to be programmed at the "0" state. Ground potential is applied to the source lines 38, bit-lines 58 and select gates 46b for non-selected columns and rows of memory cells, so only the selected memory cell is read.

The present invention incorporates a number of advantages. For example, by forming the insulation layers 40 and 44 separately, their thicknesses are decoupled and each can be optimized for the desired coupling or tunneling performance. Making oxide layer 44 thinner allows for a lower read voltage with higher cell current and higher read speed, all without sacrificing reliability. The program and erase functions are enhanced by adding the P/E gate 46a, as compared to more conventional two-gate memory cell devices. Erasure is performed by placing the high voltage on the P/E gate 46a, and not select gate 46b, where by high voltages on the word lines (select gates 46b) are avoided which increases reliability. Programming is performed by voltage coupling to the floating gate 14 from both the source 38 and P/E gate 46b (which surround three sides of the floating gate 14), while allowing the select gate 46b to independently operate the channel region 60. Lastly, manufacturing is simplified by forming the select gate 46b and P/E gate 46a from the same poly layer 46.

It is to be understood that the present invention is not limited to the embodiment(s) described above and illustrated herein, but encompasses any and all variations falling within the scope of the appended claims. For example, materials, processes and numerical examples described above are exemplary only, and should not be deemed to limit the claims. Although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Select gate 46b need not extend up and over a portion of floating gate 14, but rather could be simply formed laterally adjacent to floating gate 14. Further, as is apparent from the claims, not all method steps need be performed in the exact order illustrated or claimed, but rather in any order that allows the proper formation of the memory cell of the present invention. Lastly, single layers of material could be formed as multiple layers of such or similar materials, and vice versa, and therefore the use of "layer" of material herein includes single and multiple layers of such materials.

What is claimed is:

1. An electrically programmable and erasable memory device comprising:
   a substrate of semiconductor material of a first conductivity type;
   first and second spaced-apart regions in the substrate of a second conductivity type, with a channel region therebetween;
   an electrically conductive floating gate having a first portion disposed over and insulated from the channel region, and a second portion disposed over and insulated from the first region and including a sharpened edge;
   an electrically conductive P/E gate having a first portion disposed over and insulated from the first region, and a second portion extending up and over the floating gate second portion and insulated therefrom by a first layer of insulation material;
   an electrically conductive select gate disposed laterally adjacent to and insulated from the floating gate and disposed over and insulated from the channel region; and
   control circuitry configured to:
      place a positive voltage on the P/E gate sufficient to induce electrons to tunnel from the floating gate, through the first insulation material layer, to the P/E gate via Fowler-Nordheim tunneling, and
      place positive voltages on the first and second regions, the P/E gate and the select gate sufficient to induce electrons to move from the second region, along the channel region, and onto the floating gate via hot electron injection.

2. The device of claim 1, further comprising:
   a second layer of insulation material disposed between the select gate and the channel region having a thickness that differs from a thickness of the first layer of insulation material.

3. An array of electrically programmable and erasable memory devices comprising:
   a substrate of semiconductor material of a first conductivity type;
   spaced apart isolation regions formed on the substrate which are substantially parallel to one another and extend in a first direction, with an active region between each pair of adjacent isolation regions;
   each of the active regions including pairs of memory cells, each of the memory cell pairs including:
      a first region and a pair of second regions spaced apart in the substrate having a second conductivity type, with channel regions formed in the substrate between the first region and the second regions,
      a pair of electrically conductive floating gates each having a first portion disposed over and insulated from one of the channel regions, and a second portion disposed over and insulated from the first region and including a sharpened edge,
      an electrically conductive P/E gate having a first portion disposed over and insulated from the first region, and a pair of second portions each extending up and over one of the floating gate second portions and insulated therefrom by a first layer of insulation material, and
      a pair of electrically conductive select gates each disposed laterally adjacent to and insulated from one of the floating gates and disposed over and insulated from the channel region; and
   control circuitry configured to:
      selectively place a positive voltage on the P/E gates sufficient to induce electrons to tunnel from the floating gates, through the first insulation material layers, to the P/E gates via Fowler-Nordheim tunneling, and
      selectively place positive voltages on the first and second regions, the P/E gates and the select gates sufficient to induce electrons to move from the second regions, along the channel regions, and onto the floating gates via hot electron injection.

4. The array of claim 3, further comprising:
   a second layer of insulation material disposed between each of the select gates and one of the channel regions having a thickness that differs from a thickness of the first layers of insulation material.

* * * * *